US012339320B2

(12) United States Patent
Bottoni et al.

(10) Patent No.: US 12,339,320 B2
(45) Date of Patent: Jun. 24, 2025

(54) FORWARD ERROR CORRECTION (FEC) ENCODED PHYSICAL LAYER TEST PATTERN

(71) Applicant: Cisco Technology, Inc., San Jose, CA (US)

(72) Inventors: Fabio Bottoni, Milan (IT); Alessandro Cavaciuti, San Donato Milanese (IT)

(73) Assignee: CISCO TECHNOLOGY, INC., San Jose, CA (US)

( * ) Notice: Subject to any disclaimer, the term of this patent is extended or adjusted under 35 U.S.C. 154(b) by 125 days.

(21) Appl. No.: 18/304,568

(22) Filed: Apr. 21, 2023

(65) Prior Publication Data

US 2024/0248135 A1    Jul. 25, 2024

Related U.S. Application Data

(60) Provisional application No. 63/439,932, filed on Jan. 19, 2023.

(51) Int. Cl.
*G01R 31/00* (2006.01)
*G01R 31/3183* (2006.01)

(52) U.S. Cl.
CPC ......... *G01R 31/318385* (2013.01); *G01R 31/318371* (2013.01)

(58) Field of Classification Search
CPC .... G01R 31/318307; G01R 31/318533; G01R 31/318314; G01R 31/318371; G01R 31/31813; G01R 31/318385
See application file for complete search history.

(56) References Cited

U.S. PATENT DOCUMENTS

| | | | | |
|---|---|---|---|---|
| 7,792,183 B2* | 9/2010 | Massey | ............... | H04B 17/21 |
| | | | | 375/227 |
| 10,236,975 B2* | 3/2019 | Li | ............... | H04B 10/077 |
| 10,644,844 B1* | 5/2020 | Lin | ............... | H04L 1/0057 |
| 10,951,508 B2* | 3/2021 | Caird | ............... | H04L 43/06 |
| 11,050,527 B1* | 6/2021 | Pepper | ............... | H04L 1/0072 |
| 11,228,380 B2* | 1/2022 | Heinen | ............... | H04B 17/0085 |
| 11,876,532 B1* | 1/2024 | Chen | ............... | H03M 13/3715 |
| 11,886,312 B2* | 1/2024 | Das Sharma | ............... | G06F 11/1044 |

(Continued)

FOREIGN PATENT DOCUMENTS

EP        1968270 A2      9/2008

OTHER PUBLICATIONS

International Search Report and Written Opinion for International Application No. PCT/US2024/011725, mailed Apr. 16, 2024, 16 Pages.

(Continued)

*Primary Examiner* — Esaw T Abraham
(74) *Attorney, Agent, or Firm* — Edell, Shapiro & Finnan, LLC

(57) ABSTRACT

Techniques are provided for generating a physical test pattern that is framed within an Forward Error Correction (FEC)-encoded stream or sequence. Accordingly, in one embodiment, a method is provided that includes obtaining a physical layer test pattern for testing operation of a device; generating an FEC framed test pattern that embeds the physical layer test pattern into an FEC-encoded stream; and applying the FEC framed test pattern to the transceiver device to test physical layer operation of the device and to obtain FEC error statistics.

20 Claims, 13 Drawing Sheets

(56) References Cited

U.S. PATENT DOCUMENTS

| | | |
|---|---|---|
| 2010/0228842 A1 | 9/2010 | Kompella et al. |
| 2019/0268110 A1 | 8/2019 | Pepper |
| 2022/0385396 A1 | 12/2022 | Cartic et al. |

OTHER PUBLICATIONS

Anslow, "Scrambled idle error checker," https://grouper.ieee.org/groups/802/3/ba/public/jan10/anslow_04_0110.pdf, IEEE P802.3ba, Jan. 2010, 7 pages.

Anslow, "400GbE AMs and PAM4 test pattern characteristics," https://www.ieee802.org/3/bs/public/adhoc/logic/dec11_15/anslow_01_1215_logic.pdf, IEEE P802.3bs Task Force, Logic Ad Hoc, Dec. 11, 2015, 28 pages.

Anslow, "Test pattern characteristics," https://www.ieee802.org/3/ba/public/jan09/anslow_08_0109.pdf, IEEE P802.3ba, Jan. 2009, 14 pages.

Palkert, et al., "PRBS31Q Example Sequence," https://www.ieee802.org/3/bs/public/16_09/palkert_3bs_01_0916.pdf, Sep. 2016, 7 pages.

Anslow, "FEC performance with PAM4 precoding," https://www.ieee802.org/3/bs/public/15_07/anslow_3bs_04_0715.pdf, IEEE P802.3bs Task Force, Jul. 2015, 13 pages.

Keysight Technologies, "N4891A-400GBASE FEC-aware Receiver Test," Data Sheet, https://www.keysight.com/us/en/assets/7018-06900/data-sheets/5992-4243.pdf, Mar. 2021, 13 pages.

Dawe, "Improved SSPRQ pattern for testing optical transmitters," https://www.ieee802.org/3/bs/public/17_03/dawe_3bs_01a_0317.pdf, Mar. 2017, 7 pages.

Anslow, "Baseline wander with FEC," https://www.ieee802.org/3/bs/public/17_05/anslow_3bs_03_0517.pdf, IEEE P802.3bs Task Force, May 2017, 18 pages.

Anslow, "SSPRQ test pattern," https://www.ieee802.org/3/bs/public/adhoc/smf/16_04_19/anslow_01_0416_smf.pdf, IEEE P802.3bs Task Force, Apr. 2016, 18 pages.

\* cited by examiner

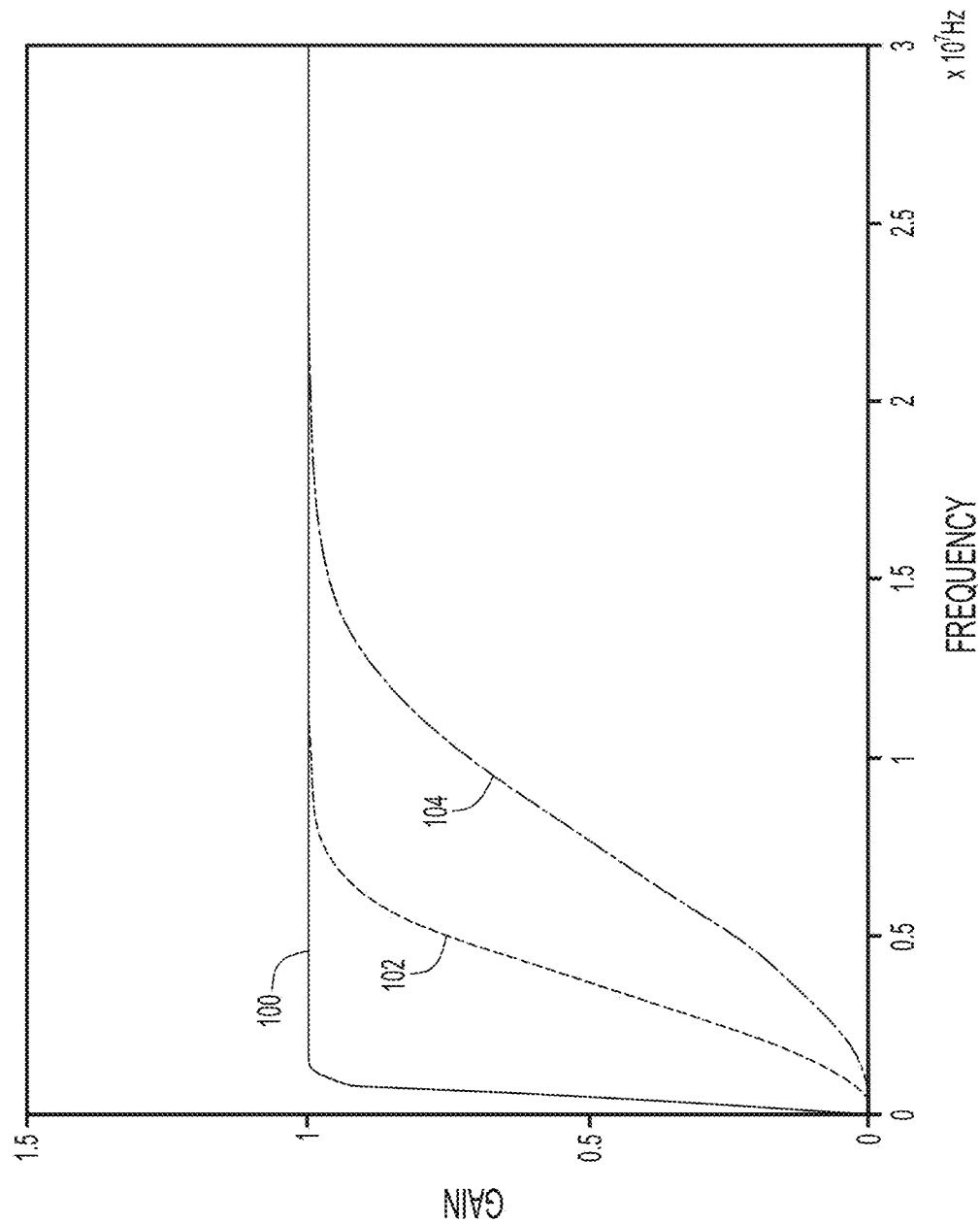

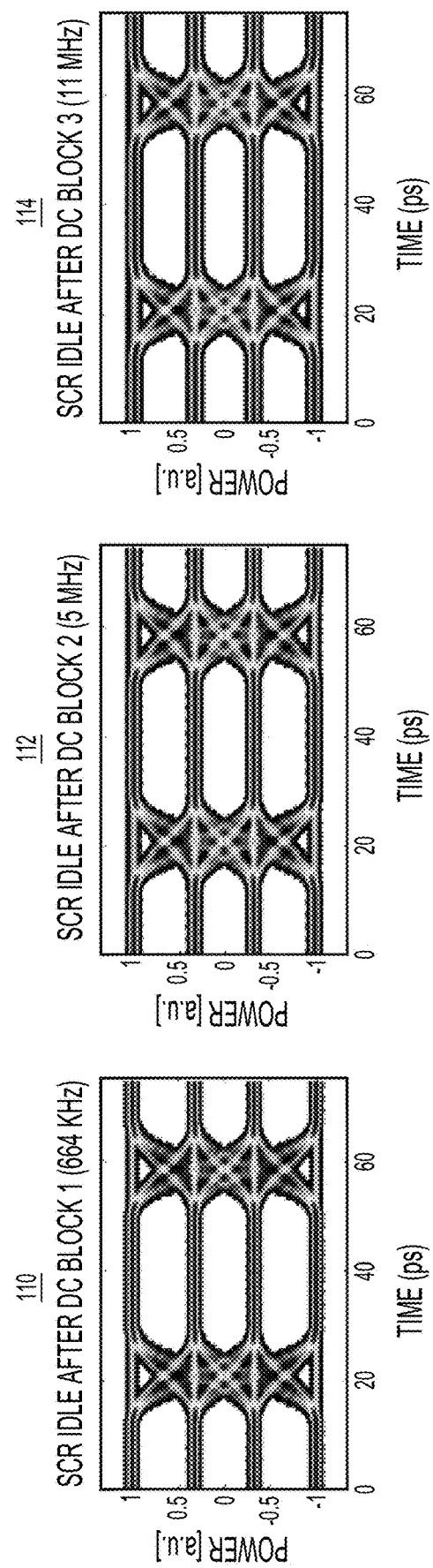

FORWARD ERROR CORRECTION (FEC) ENCODED PHYSICAL LAYER TEST PATTERN

CROSS REFERENCE TO RELATED APPLICATION

This application claims priority to U.S. Provisional Patent Application No. 63/439,932, filed Jan. 19, 2023, the entirety of which is incorporated herein by reference.

TECHNICAL FIELD

The present disclosure relates to test patterns for communication systems and devices.

BACKGROUND

Test patterns play a role in the assessment of quality of high speed serializer-deserializer (SerDes) and opto-electronic devices in communication devices and systems. The test patterns may be used for testing physical medium dependent (PMD) sublayers, and for chip-to-module (C2M) interfaces, for example.

BRIEF DESCRIPTION OF THE DRAWINGS

FIGS. 1A-1D show simulation data for the Scrambled Idle pattern for a baud rate of 26.5625 Gigabaud (Gbaud).

DESCRIPTION OF EXAMPLE EMBODIMENTS

Overview

Figure 2C:
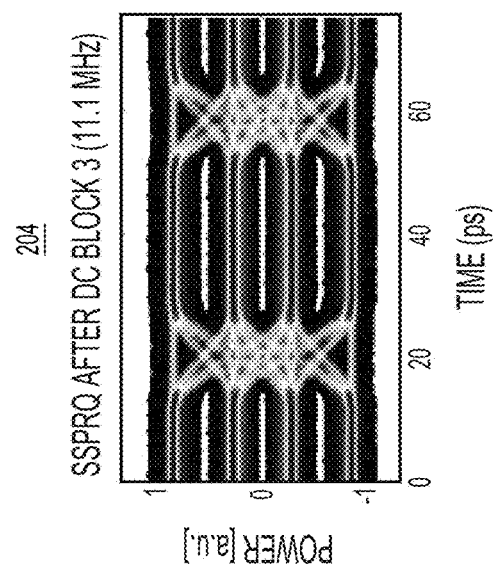
FIGS. 2A-2C show simulation data for the Short Stress Pseudorandom Sequence (SSPRQ) test pattern for a baud rate of 26.5625 Gbaud.

Presented herein are techniques for providing a physical test pattern that is framed within an FEC-encoded stream or sequence. Accordingly, in one embodiment, a method is provided that includes obtaining a physical layer test pattern for testing operation of a device; generating an FEC framed test pattern that embeds the physical layer test pattern into an FEC-encoded stream; and applying the FEC framed test pattern to the transceiver device to test physical layer operation of the device and to obtain FEC error statistics.

Example Embodiments

Certain bit patterns in a stream of bits are known to cause to impairments on many circuits/operations (decisions). Test patterns, called physical layer test patterns, have been developed to stress certain components, functions or interfaces in devices, in order to determine whether the device reacts/handles the test patterns as expected. To have those stresses/impairments imposed on the circuitry, components or functions of a device, the physical symbol pattern needs to have a certain shape. For example, a long sequence of zero's and one's is useful to trigger what is called baseline wandering in a transceiver device.

It is desirable to embed or interweave the physical layer test pattern in a forward error correction (FEC) coded sequence that allows a FEC decoder in a device to decode the sequence in which the physical layer test pattern is embedded in order to measure the effects of the physical layer test pattern after FEC decoding has made performed its error corrections. Without embedding the test pattern in the FEC encoding, one cannot be sure what the penalty or impairment is over FEC performance because the overall FEC performance depends on the statistics of the errors.

The applicable standards body, such as the IEEE, specifies the coding and associated test patterns to be used by a given communication standard. As one example, Table 124-9 of clause 124 400GBASE-DR4) specifies a range of allowed test patterns for PMD sublayers and chip-to-module interfaces. (Annex 120E 400GAUI-8).

TABLE 124-9

Test Patterns

| Pattern | Pattern Description | Defined in |
| --- | --- | --- |
| Square wave | Square wave (8 threes, 8 zeros) | 120.5.11.2.4 |
| 3 | PRBS31Q | 120.5.11.2.2 |
| 4 | PRBS13Q | 120.5.11.2.1 |
| 5 | Scrambled Idle | 119.2.4.9 |
| 6 | SSPRQ | 120.5.11.2.3 |

Table 124-10 provides test patterns to be used (for 400GBASE-DR4) in each measurement and lists references to the subclauses in which each parameter is defined.

TABLE 124-10

Test Patterns

| Parameter | Pattern | Related Subclause |
| --- | --- | --- |
| Wavelength | Square wave, 3, 4, 5, 6, or valid 400GBASE-R signal | 124.8.2 |

TABLE 124-10-continued

Test Patterns

| Parameter | Pattern | Related Subclause |
|---|---|---|
| Single mode suppression ratio | 3, 5, 6 or valid 400GBASE-R signal | — |
| Average optical power | 3, 5, 6 or valid 400GBASE-R signal | 124.8.3 |
| Outer Optical Modulation Amplitude ($OMA_{outer}$) | 4 or 6 | 124.8.4 |
| Transmitter and dispersion eye closure for PAM4 | 6 | 124.8.5 |
| Extinction ratio | 4 or 6 | 124.8.6 |
| $RIN_{21.4}OMA$ | Square wave | 124.8.7 |
| Stressed receiver conformance test signal calibration | 6 | 124.8.9 |
| Stressed receiver sensitivity | 3 or 5 | 124.8.9 |

IEEE Pulse Amplitude Modulation 4-Level (PAM4) clauses require the use of the Reed-Solomon code RS (544,514), also known as KP4. This is a type of FEC code used to ensure error-free operation. Forward error correction is performed in units called codewords (CW) and performance is expressed as RS(n, k, a, b), where:

n: Number of FEC symbols in one codeword
k: Number of message symbols in one codeword
a: Maximum number of correctable errors in one codeword
b: Number of bits per symbol

|  |  | RS-FEC (544, 514) |
|---|---|---|
| FEC Symbol Count/CW | n | 544 |
| Message FEC Symbol Count | n − k | 30 |
| Correctable FEC Symbol Count | a | 15 |
| Bit Count (/FEC Symbol) | b | 10 |

More than 16 errors in an FEC Codeword is an Uncorrectable Codeword.

Two metrics are commonly used to characterize communication link (between a transmitter and a receiver) performance:

Pre-FEC Bit Error Rate (BER): When bit errors are randomly distributed, the Frame Loss Ratio (FLR) can be easily derived from the pre-FEC BER (historically the main metric). FLR: the number of transmitted frames not received as valid by the media access control (MAC) layer divided by the total number of transmitted frames.

FEC Codewords analysis: In real circumstances, an adaptive Decision Feedback Equalizer (DFE), jitter mechanisms and pattern-dependent effects are a major source of burst errors. The only way to discover those effects is by testing beyond BER and analyzing how the FEC symbol errors are distributed within the codewords.

Starting from PAM4, FEC-aware testing became useful to achieve a well performing communication system.

Test pattern #5 (Scrambled Idle, Table 124-9) is the only test pattern, defined by IEEE, that gives insight on both pre-FEC BER and FEC codewords distribution. Test pattern #5, however, has one serious limitation. The stressing features of a Pseudorandom Binary Sequence (PRBS), such as an Short Stress Pseudorandom Sequence (SSPRQ) physical layer test pattern (such as long consecutive symbols), are lost.

As an example, explained below is the impact of three DC blocks on:

Test pattern #5 (scrambled idle)
SSPRQ* (*constructed from three sections of a PRBS31 binary sequence. It has the right stress points and has similar statistical properties as PRBS31 (over 2 billion symbols) but is shorter.)

FIGS. 1A-1D show simulation data for the Scrambled Idle (SCR) pattern for a baud rate of 26.5625 Gbaud. Three DC blocks are considered as shown in FIG. 1A at 100, 102 and 104, with the following cut-off frequencies:

664 KHz (=BaudRate/40e3) shown at 100
5 MHZ (=BaudRate/5000) shown at 102
11 MHZ (=BaudRate/2400)—worst case, shown at 104

FIGS. 1B, 1C and 1D show plots 110, 112 and 114, respectively, of the eye pattern simulation data resulting from applying the Scrambled Idle test pattern to the DC blocks with the cut-off frequency patterns shown in FIG. 1A at reference numerals 100, 102 and 104, respectively.

Figure 2B:
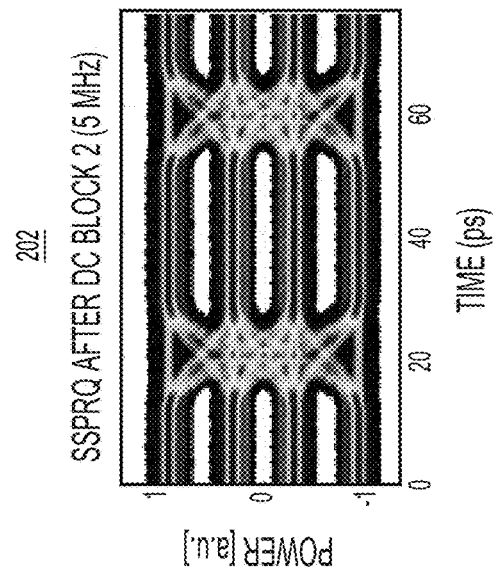
Figure 2A:
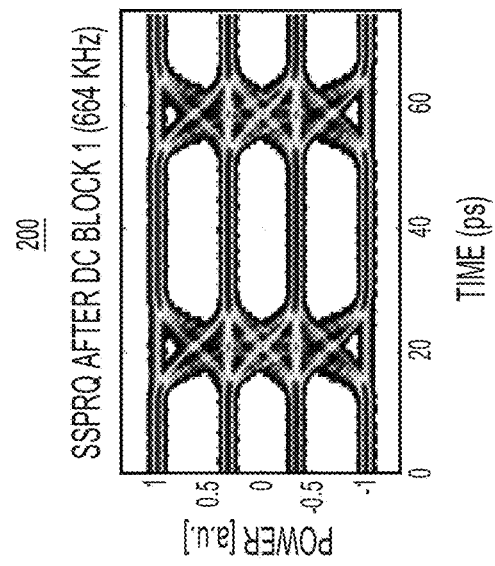

Similarly, FIGS. 2A-2C show plots 200, 202 and 204 of eye pattern simulation data for the SSPRQ test pattern for the same DC block cut-off frequencies shown in FIG. 1A at reference numerals 100, 102 and 104, respectively.

Figure 3:
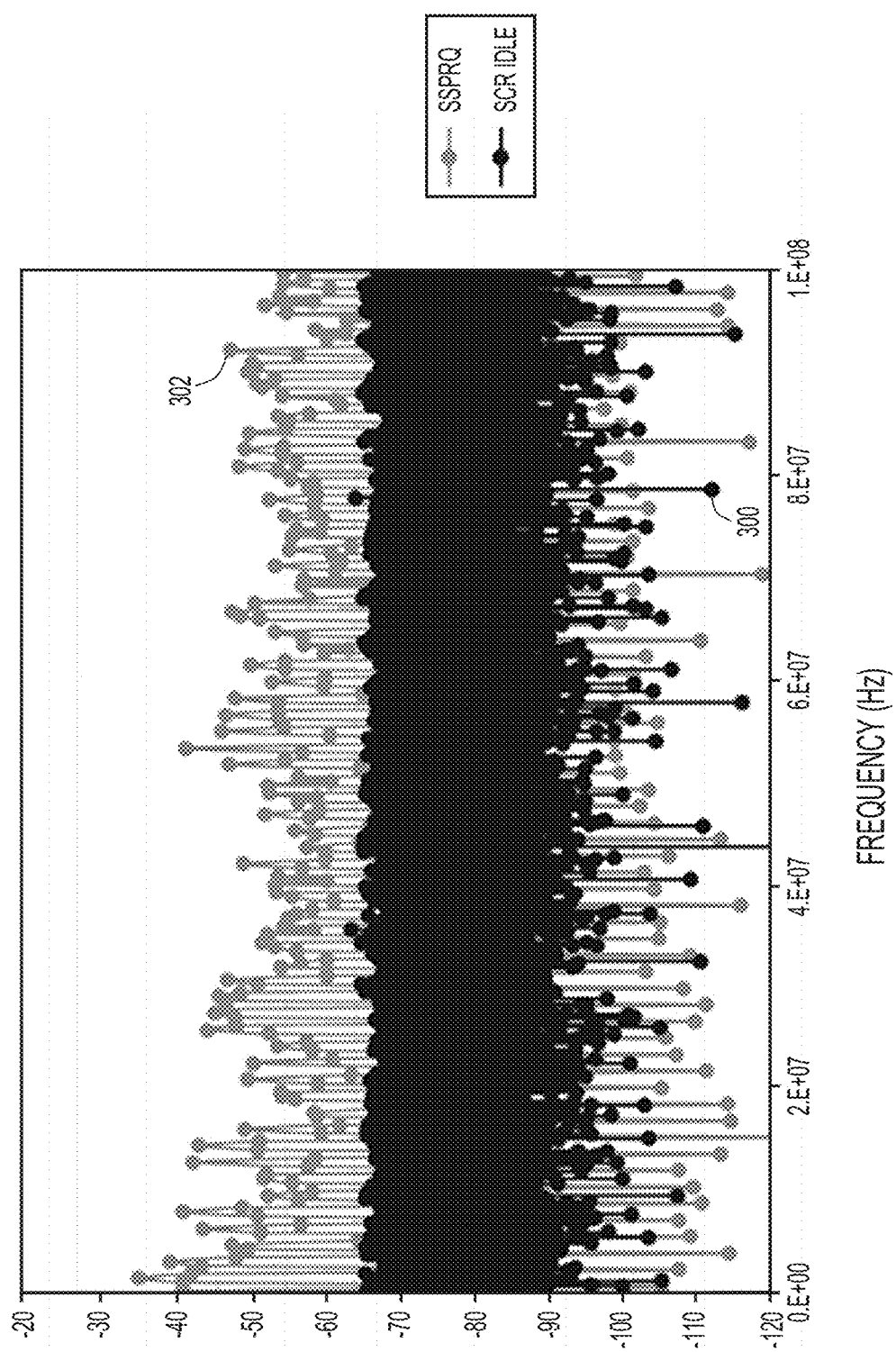
FIG. 3 shows an electrical spectrum comparing the SSPRQ test pattern and the scramble idle test pattern.

FIG. 3 shows the plots 300 and 302 of the electrical spectrum (up to 100 MHZ) of the SSPRQ and Scrambled Idle test patterns, respectively.

Based on FIGS. 1A-1D, 2A-2C and 3, it is concluded that the Scrambled Idle pattern does not cover the low frequency area of the spectrum, like the SSPRQ (or the PRBS31Q) test pattern does. Even when a worst-case DC block (Baud/2400) is used (shown at reference numeral 104 in FIG. 1A), the Scrambled Idle pattern does not show any penalty.

Presented herein are techniques that involve "reverse engineering" the FEC coding and creating a sequence that, after the FEC encoding, has a desired physical layer test pattern. This results in a FEC-coded sequence, also referred to as an FEC framed test pattern, that can induce the stresses/impairments that are desired to be imposed in a PRBS sequence. Since the physical layer test pattern is part of (embedded in) an FEC-encoded stream, the FEC decoding and FEC corrections are applied. This allows for observing the effects of the physical layer test pattern (e.g., long sequences of ones and zeros) on the FEC decoding and error correction. FEC effectiveness depends heavily on statistics of the errors, because if there is a burst of errors, then FEC decoding may not be able to correct the errors.

In one non-limiting example, the physical layer test pattern is an SSPRQ test pattern and the FEC framed test pattern is referred to as "Framed SSPRQ" that is designed to have KP4 FEC encoding to enable FEC aware testing and codewords analysis. The Framed SSPRQ test pattern also has stressing properties of the SSPRQ at C2M level. As described further below, the Framed SSPRQ Test pattern is designed such that SSPRQ is taken as a reference stressing signal at the C2M level and SSPRQ is subdivided into 25.5 "killer" codewords (rounded to 26). For each of these codewords, a reverse engineering is performed in order to calculate the payload to be used before the FEC encoding ("Killer-1").

Figure 4:
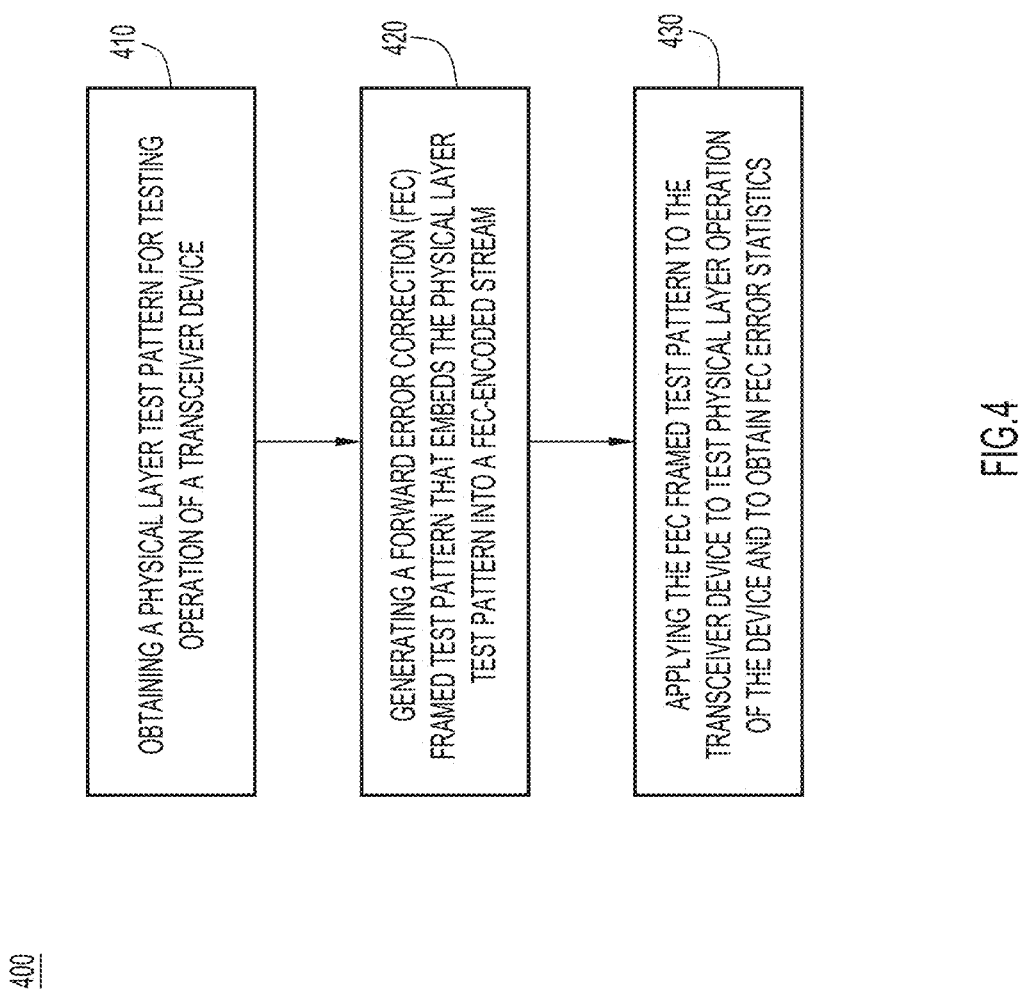
FIG. 4 is a flow chart that depicts, at a high-level, a method for generating a forward error correction (FEC) framed physical layer test pattern for applying to a device to be tested, according to an example embodiment.

Reference is now made to FIG. 4. FIG. 4 illustrates a flow chart depicting, at a high-level, a method 400 for generating a FEC framed test pattern according to the techniques presented herein. The method 400 may be performed by one or more computing devices that have interface connectivity to a transceiver or other device to be tested.

At step 410, a physical layer test pattern for testing operation of a device. For example, the physical layer test pattern may be a now known or hereinafter developed test pattern, such as an SSPRQ test pattern, as an example. The physical layer test pattern may comprise sequences of logical levels, such as sequences of ones and zeros. The device being tested may be any device having one or more physical layer components or functions. An example of such a device is an opto-electrical transceiver device, any device having a SerDes component or function or any device having a C2M interface.

At step 420, the method 400 includes generating an FEC framed test pattern that embeds the physical layer test pattern into an FEC-encoded stream.

At step 430, the method 400 includes applying the FEC framed test pattern to the transceiver device to test physical layer operation of the transceiver device and to obtain FEC error statistics.

Figure 5:
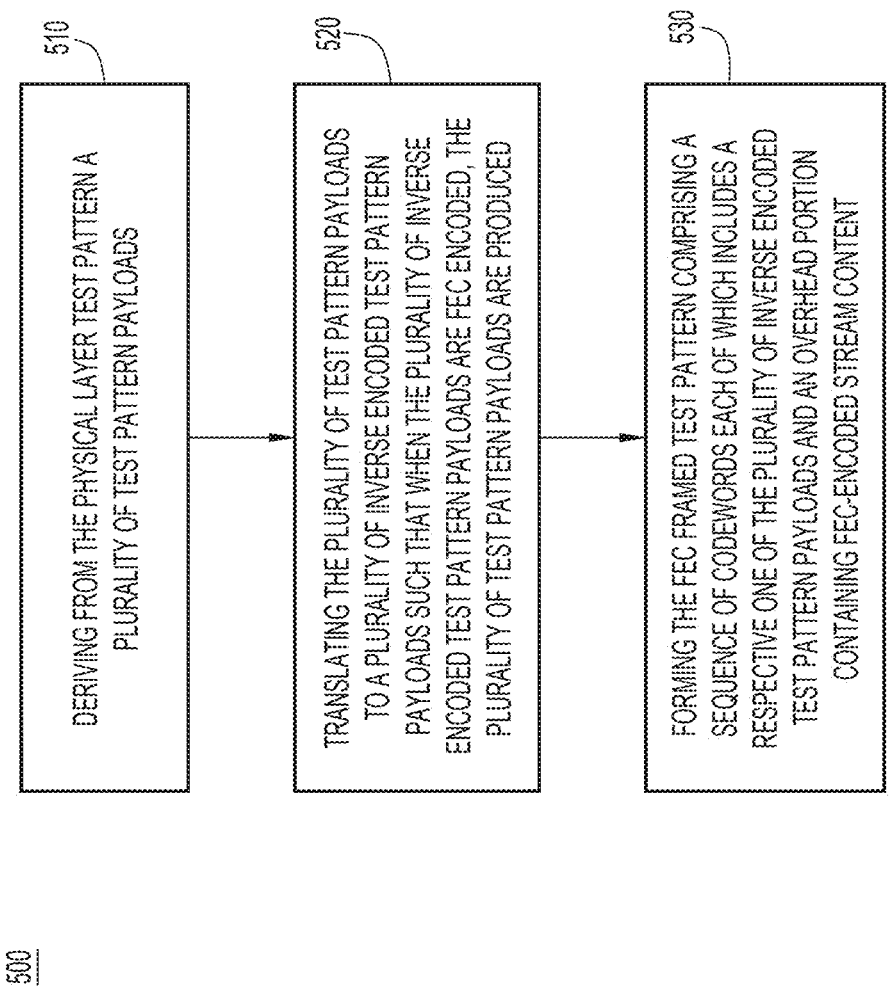
FIG. 5 is a flow chart that illustrates steps to generate a FEC framed physical layer test pattern, according to an example embodiment.

Reference is now made to FIG. 5. FIG. 5 illustrates a flow chart that depicts operations 500 performed as part of the generating step 420 of the method 400 of FIG. 4. At step 510, a plurality of test pattern payloads are derived from the physical layer test pattern. As explained below, this may involve splitting a physical layer test pattern into different portions or segments. At step 520, the plurality of test pattern payloads are translated to a plurality of inverse encoded test pattern payloads such that when the plurality of inverse encoded test pattern payloads are FEC encoded, the plurality of test pattern payloads are produced. Thus, step 520 involves a sort of reverse FEC encoding of the physical layer test patterns. At step 530, the FEC framed test pattern is formed from a sequence of codewords each of which includes a respective one of the plurality of inverse encoded test pattern payloads and an overhead portion containing FEC-encoded stream content. Further details of the operations of steps 520 and 530 are provided below.

Figure 6:
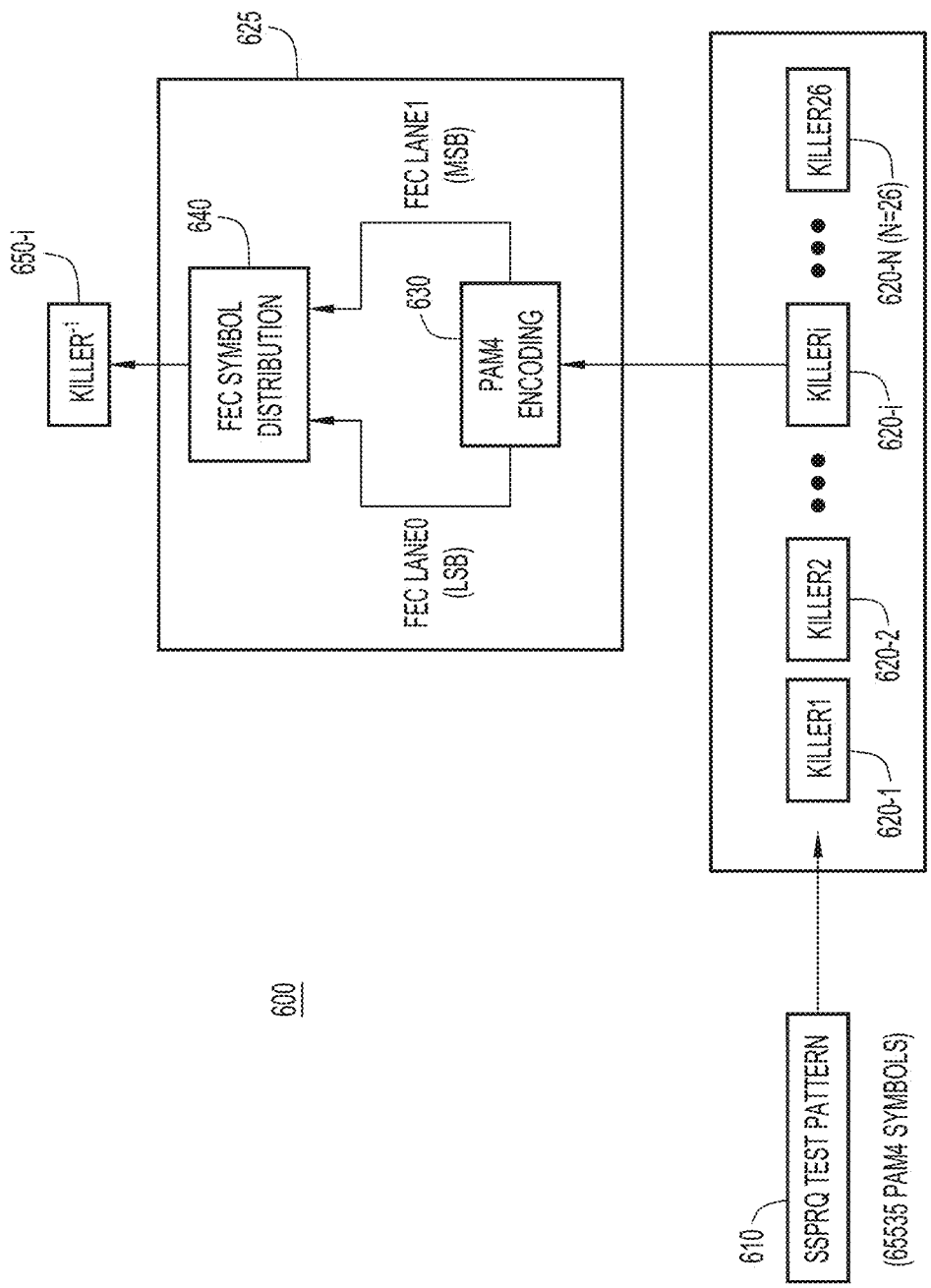
FIG. 6 is a diagram depicting how an SSPRQ physical layer test pattern is divided into payloads for FEC encoding into an FEC framed SSPRQ test pattern, according to an example embodiment.

With reference to FIG. 6, a process 600 for creation of an FEC framed test pattern is described for an example in which the physical layer test pattern is an SSPRQ test pattern. The SSPRC test pattern is graphically depicted at 610. In this example, the FEC coding employed is KP4 FEC encoding, to enable FEC aware physical layer testing and codewords analysis. The stressing properties of the SSPRQ test pattern are at the chip-to-module (C2M) level.

The FEC Framed SSPRQ Test Pattern is generated such that the SSPRQ pattern is taken as a reference stressing signal at the C2M level. The SSPRQ test pattern 610 is subdivided into a predetermined number of payloads, e.g., 25.5 "killer" payloads (rounded to 26), shown at 620-1 to 620-N (where N=26 in this example). For each of these payloads, a reverse engineering (or inverse encoding) process 625 is performed in order to calculate an inverse encoded test pattern payload to be used before the FEC encoding.

These inverse encoded test pattern payloads are denoted "Killer-1". Thus, there is a Killer1$^{-1}$ generated for payload 620-1, a Killer2$^{-1}$ generated for payload 620-2, and so on. The inverse encoded test pattern payload Killer-1 is computed by, in the example where PAM4 modulation is used, PAM4 encoding of the payload 620-$i$ at 630, and then FEC symbol distribution at 640 to produce inverse encoded test pattern payload 650-$i$. The inverse encoding process 625 is performed for each of the N "killer" payloads.

Figure 7:
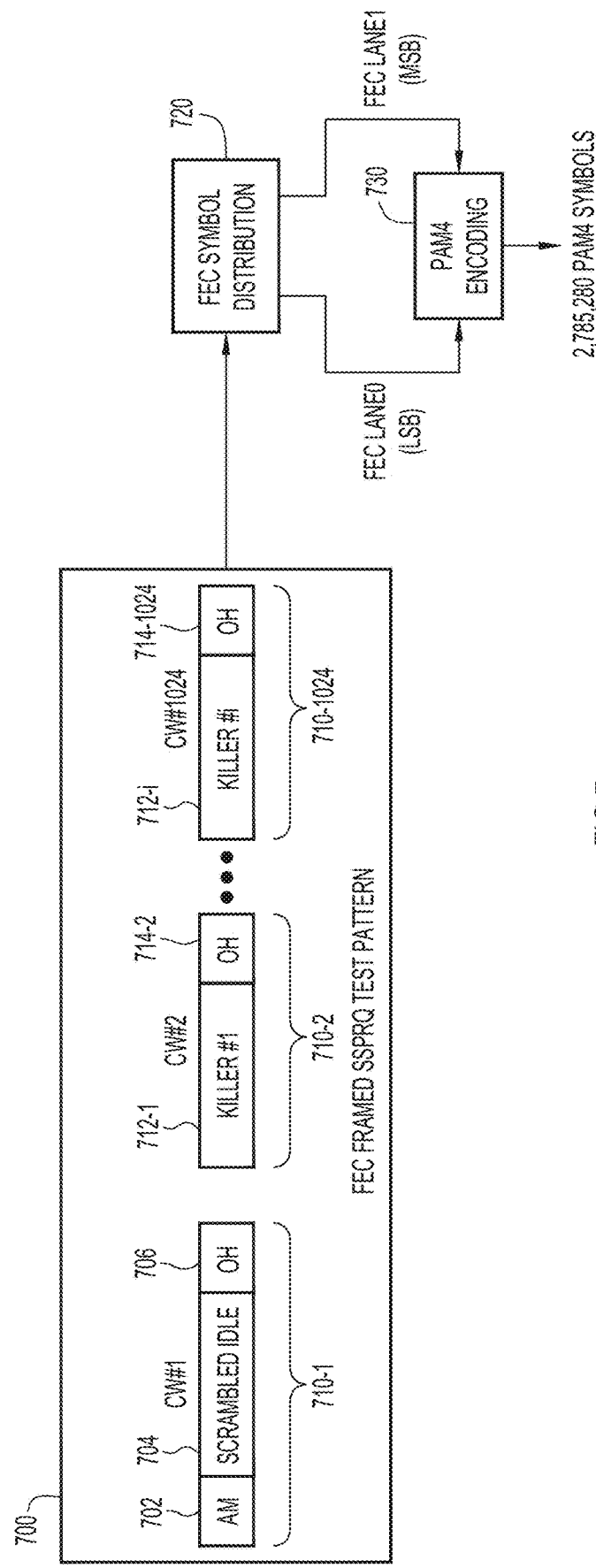
FIG. 7 is a diagram depicting an example of an FEC Framed SSPRQ Test Pattern generated according to the techniques presented herein.

FIG. 7 shows an example of an FEC Framed SSPRQ Test Pattern 700 for 50GAU-1. A 50GAUI-1 "Framed SSPRQ" pattern has 1024 codewords (CW's) 710-1, 710-2 to 710-1024. CW 710-1 includes an alignment marker (AM) spacing field 702 for 50GAUI-1, a Scrambled Idle pattern field 704 and associated FEC overhead (OH) content 706. CW 710-2 through CW 710-1024 contain the inverse encoded test pattern payloads 712-1, 712-$i$, . . . , 712-N (N=26) (generated according to the process depicted in FIG. 6) spaced by corresponding or associated FEC overhead (OH) content 714-2 to 714-1024.

In the example of FIG. 7, the FEC Framed SSPRQ Test Pattern 700 is provided to an FEC symbol distribution block 720 and then to a PAM4 encoder 730. The output of the PAM4 encoder 730 is stream of PAM4 symbols, and in particular 2,785,280 PAM4 symbols, for this particular example.

When used to form PAM4 (e.g., for 100G-DR), the FEC encoding implements a Reed Solomon (544,514) FEC code that operates over the Galois Field GF ($2^{10}$), where the symbol size is 10 bits. The encoder processes k=514 message symbols to generate 2t=30 parity symbols that are appended to the message to produce a codeword of n=k+2t=544 symbols.

Figure 8:
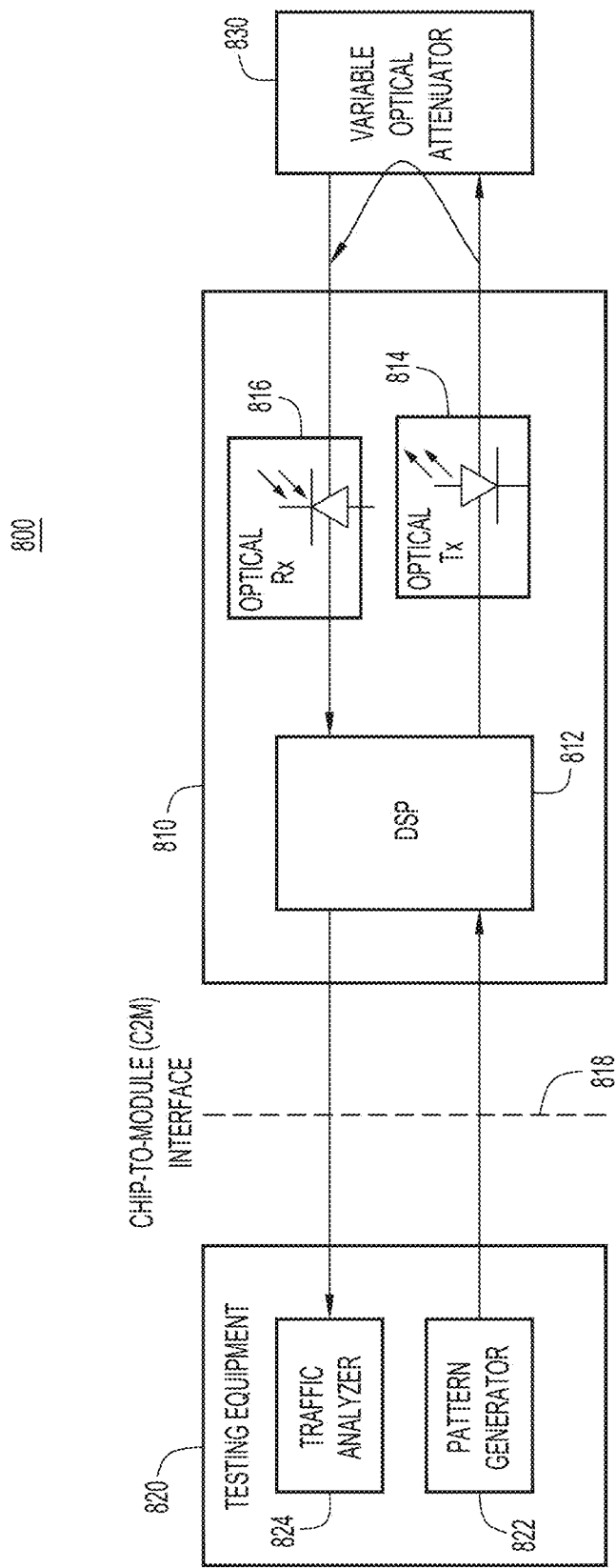
FIG. 8 illustrates a block diagram of a testing arrangement in which an FEC framed physical layer test pattern is provided to a device and results are analyzed, according to an example embodiment.

Reference is now made to FIG. 8. FIG. 8 shows an example setup of testing arrangement 800 for which a FEC framed testing pattern may be used. In the testing arrangement 800, a device 810 is being tested. In one example, the device 810 is an optical transceiver device that includes a digital signal processor (DSP) 812 that performs electrical domain signal processing, an optical transmitter (Tx) 814 and an optical receiver (Rx) 816. The device 810 may be a Small Form Factor Pluggable (SFP) optical transceiver, such as an SFP-56 optical module, for example. The device 810 includes a C2M interface 818. For the transmit signal path via the DSP 812 and optical transmitter 814, the DSP 812 implements a FEC encoder and a modulation encoder (e.g., PAM4 encoder). Similarly, for the receive signal path the DSP 812 implements an FEC decoder and a modulation decoder (e.g., PAM4 decoder).

The testing arrangement 800 includes a testing equipment 820 that includes a pattern generator 822 and a traffic analyzer 824. Testing equipment 820 is enhanced such that the pattern generator 822 generates an FEC framed test pattern according to the techniques described above in connection with FIGS. 4-7. The pattern generator 822 generates the FEC framed test pattern, such as an FEC Framed SSPRQ Test Pattern 700 described above, and supplies it via the C2M interface 818 to the DSP 812 of device 810. The testing arrangement 800 further includes a variable optical attenuator (VOA) 830 that loops back an optical transmit signal from the optical transmitter 814 to the optical receiver 816 of device 810.

In operation, the testing equipment 820 generates a FEC framed test pattern, such as a Framed SSPRQ Test Pattern, that is coupled to the transceiver device via the C2M interface 818 to the DSP 812. The DSP 812 performs the modulation encoding and FEC encoding functions on the FEC framed test pattern that is then coupled to the optical transmitter 814 that produces an optical transmit signal that is looped back by the VOA 830 to the optical receiver 816. The optical receiver converts the optical receive signal to an electrical receive signal. The DSP 812 processes the electrical receive signal (with modulation decoding and FEC decoding functions, among other functions) and produces a baseband receive signal that is output, via the C2M interface 818, to the traffic analyzer 824 of the testing equipment 820. The traffic analyzer 824 performs various types of analysis on the baseband receive signal, including analysis of FEC symbol error count, bit error rate (BER) that can relate to performance of various physical layer functions of the device 810 as well as the C2M interface 818.

Figure 9:
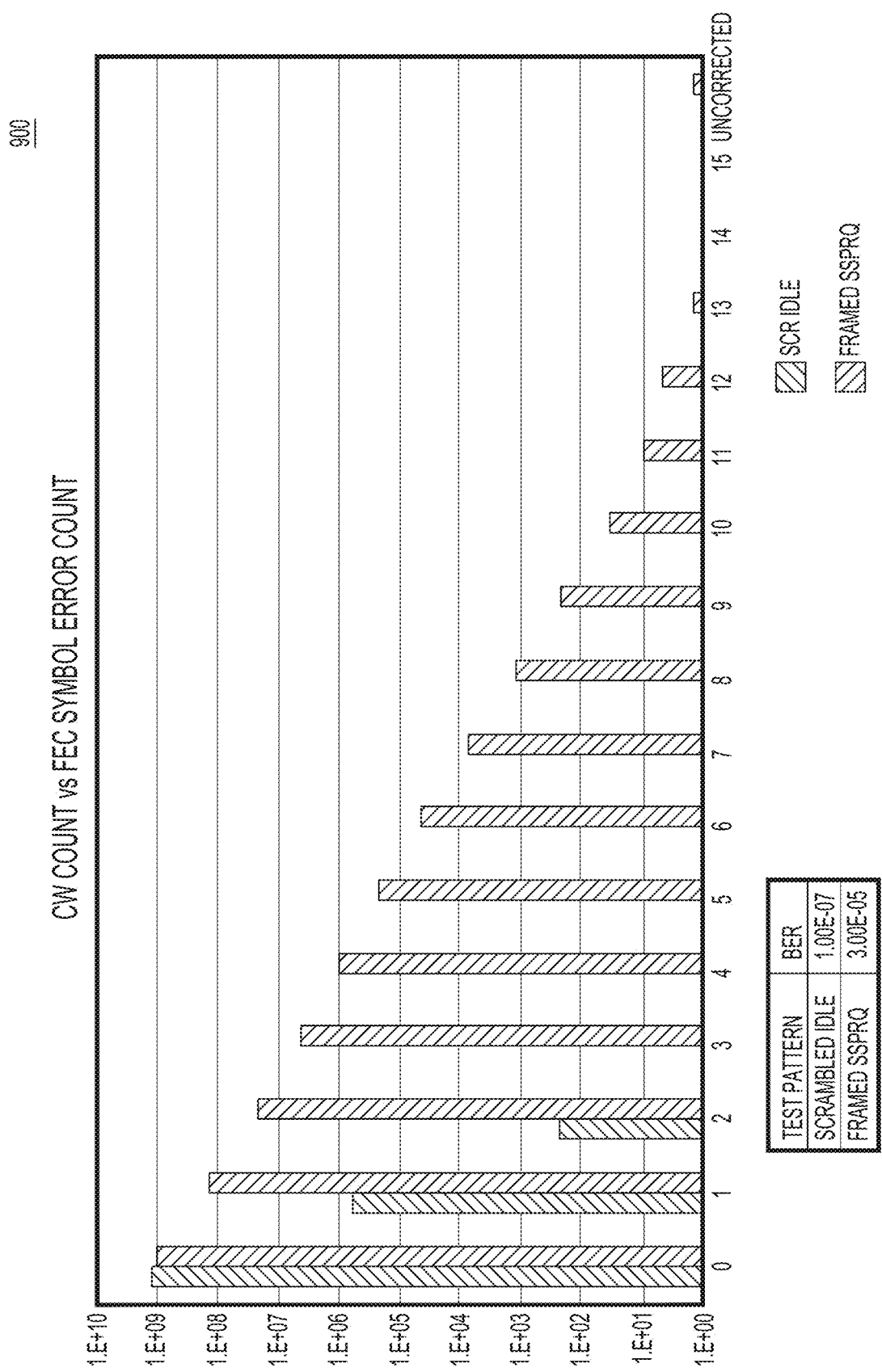
FIG. 9 is a chart depicting an example of the enhanced analysis that may be obtained using an FEC framed physical layer test pattern, according to an example embodiment.

Turning to FIG. 9, data 900 are shown as an example of the analysis that the traffic analyzer 824 of the testing equipment 820 shown in FIG. 8 may perform. FIG. 9 shows plots associated with two physical layer test patterns (Scrambled idle, FEC Framed SSPRQ). Performance is measured in terms of BER and FEC codewords (CW) analysis. As shown in FIG. 9, even though the BER is below the KP4 threshold (2.4E-4), the transceiver device that exhibits the test results shown in FIG. 9 has uncorrectable codewords when a Framed SSPRQ test pattern is used. By using a Framed SSPRQ test pattern, weakness or failures can be identified that are not possible to identify with a Scrambled Idle patterns.

Figure 10:
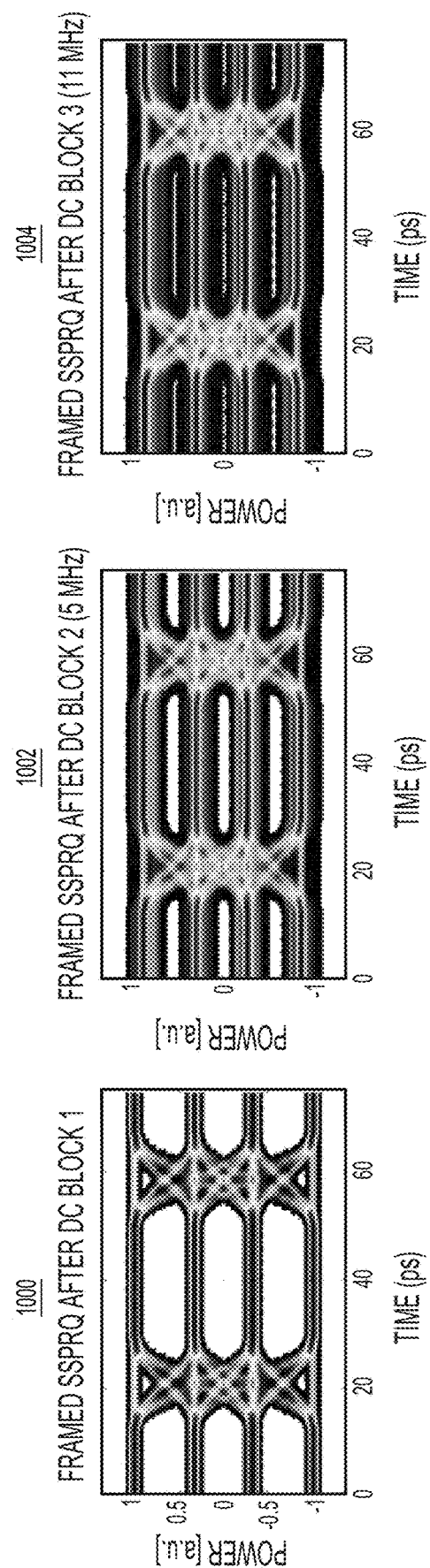
FIGS. 10A-10C illustrate eye diagrams obtained for the FEC Framed SSPRQ Test Pattern, similar to the diagrams shown in FIGS. 1B-1D and 2A-2C.

FIGS. 10A-10C illustrate plots of eye diagrams 1000, 1002 and 1004 obtained for the FEC Framed SSPRQ pattern, using the setup similar to that used for the diagrams shown in FIGS. 1A-1D and 2A-2C, for the different DC blocks shown in FIG. 1A. FIGS. 10A-10C thus show that the FEC Framed SSPRQ test pattern has an impact on the DC blocks that is comparable to for an SSPRQ pattern that is not FEC-framed.

Figure 11:
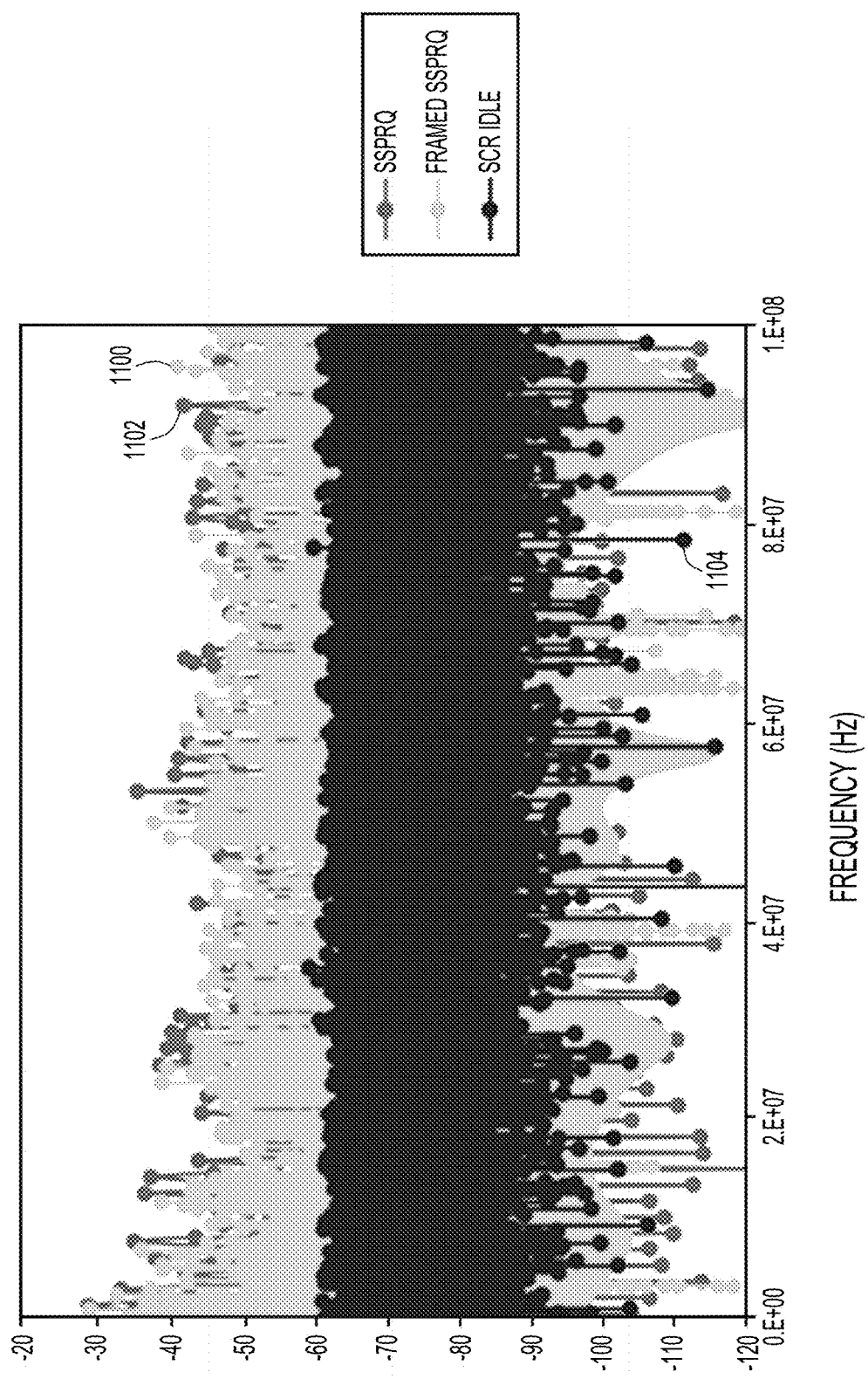
FIG. 11 illustrates plots showing a spectrum comparison between the FEC Framed SSPRQ Test Pattern, an SSPRQ test pattern (not FEC framed) and the Scrambled Idle pattern.

FIG. 11 illustrates the electrical spectrum (DC to 100 MHZ) using the FEC Framed SSPRQ test pattern compared to the Scrambled Idle pattern and the SSPRQ pattern that is not FEC-framed. The FEC Framed SSPRQ test pattern shown at reference numeral 1100 covers the low frequency area of the spectrum, like the SSPRQ test pattern that is not FEC-framed, as shown at 1102. The spectrum of the Scrambled Idle test pattern is shown at reference numeral 1104.

In summary, test patterns play a role in the assessment of quality of high speed SerDes and opto-electronic devices. The patterns defined by the IEEE standard have limitations:
SSPRQ/PRBS31Q: Lose insight on the FEC codewords distribution.
Scrambled Idle: Lose the features of stressing patterns (particularly in the low frequency region).

To overcome these limitations, a FEC framed physical layer test pattern is presented herein that is designed to have stressing properties of the physical layer test pattern (such as SSPRQ) at C2M level and FEC encoding to enable FEC aware testing. These techniques can be leveraged to significantly enhance the assessment of current and next-generation SerDes and opto-electronic devices (>25G Baud/lane).

Figure 12:
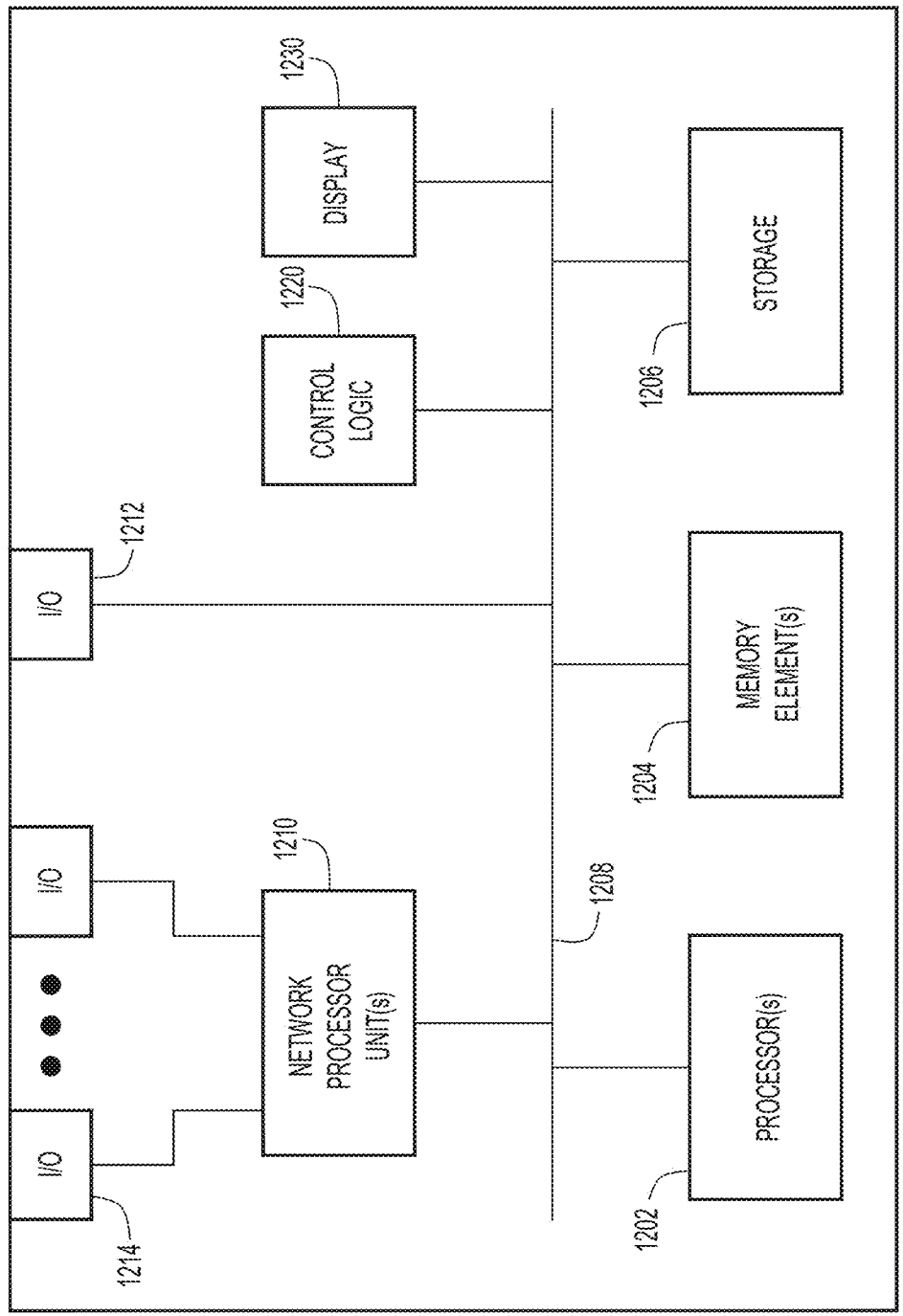
FIG. 12 is a hardware block diagram of a device that may perform functions associated with any combination of operations in connection with the techniques depicted and described in FIGS. 4-11, according to various example embodiments.

FIG. 12 is a hardware block diagram of a device, e.g., testing equipment 820 (FIG. 8), that may perform functions associated with any combination of operations in connection with the techniques depicted in FIGS. 4-11, according to various example embodiments. It should be appreciated that FIG. 12 provides only an illustration of one example embodiment and does not imply any limitations with regard to the environments in which different example embodiments may be implemented. Many modifications to the depicted environment may be made.

In at least one embodiment, the device 1200 may include one or more processor(s) 1202, one or more memory element(s) 1204, storage 1206, a bus 1208, one or more network processing unit(s) 1210 (e.g., network interface cards), one or more I/O interface(s) 1212, one or more network I/O interfaces 1214 (e.g., network ports) and control logic 1220. The control logic 1220 may include one or more software programs that, when executed by the one or more processor(s) 1202, cause the device 1200 to perform the operations of the pattern generator 822 and traffic analyzer 824 of the testing equipment 820 shown in FIG. 8. The device 1200 may further include a display 1230 to display the testing results generated by the traffic analyzer 824, for example. The testing results can take the form of the plots shown in FIGS. 9, 10A-10C and 11, for example.

In at least one embodiment, processor(s) 1202 is/are at least one hardware processor configured to execute various tasks, operations and/or functions for device 1200 as described herein according to software and/or instructions configured for device 1200. Processor(s) 1202 (e.g., a hardware processor) can execute any type of instructions associated with data to achieve the operations detailed herein. In one example, processor(s) 1202 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, one or more memory element(s) 1204 and/or storage 1206 is/are configured to store data, information, software, and/or instructions associated with device 1200, and/or logic configured for memory element(s) 1204 and/or storage 1206. For example, any logic described herein (e.g., control logic 1220) can, in various embodiments, be stored for device 1200 using any combination of memory element(s) 1204 and/or storage 1206. Note that in some embodiments, storage 1206 can be consolidated with one or more memory elements 1204 (or vice versa), or can overlap/exist in any other suitable manner. In one or more example embodiments, process data is also stored in the one or more memory elements 1204 for later evaluation and/or process optimization.

In at least one embodiment, bus 1208 can be configured as an interface that enables one or more elements of device 1200 to communicate in order to exchange information and/or data. Bus 1208 can be implemented with any architecture designed for passing control, data and/or information between processors, memory elements/storage, peripheral devices, and/or any other hardware and/or software components that may be configured for device 1200. In at least one embodiment, bus 1208 may be implemented as a fast kernel-hosted interconnect, potentially using shared memory between processes (e.g., logic), which can enable efficient communication paths between the processes.

I/O interface(s) 1212 allow for input and output of data and/or information with other entities that may be connected to device 1200. For example, I/O interface(s) 1212 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards. The I/O interfaces 1212 may also be of a type suitable to communicate with a device to be tested, as shown in FIG. 8.

In various embodiments, control logic 1220 can include instructions that, when executed, cause processor(s) 1202 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1220) may be identified based upon the application(s) for which they are implemented in a specific embodiment. However, it should be appreciated that any particular program nomenclature herein is used merely for convenience, and thus the embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, the storage 1206 and/or memory elements(s) 1204 can store data, software, code, instructions (e.g., processor instructions), logic, parameters, combinations thereof, and/or the like used for operations described herein. This includes the storage 1206 and/or memory elements(s) 1204 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

To the extent that embodiments presented herein relate to the storage of data, the embodiments may employ any number of any conventional or other databases, data stores or storage structures (e.g., files, databases, data structures, data, or other repositories, etc.) to store information.

In some aspects, the techniques described herein relate to a method including: obtaining a physical layer test pattern for testing operation of a device; generating a forward error correction (FEC) framed test pattern that embeds the physical layer test pattern into an FEC-encoded stream; and applying the FEC framed test pattern to the device to test physical layer operation of the device and to obtain FEC error statistics.

In some aspects, the techniques described herein relate to a method, wherein generating the FEC framed test pattern includes: deriving from the physical layer test pattern a plurality of test pattern payloads; translating the plurality of test pattern payloads to a plurality of inverse encoded test pattern payloads such that when the plurality of inverse encoded test pattern payloads are FEC encoded, the plurality of test pattern payloads are produced; and forming the FEC framed test pattern including a sequence of codewords each of which includes a respective one of the plurality of inverse encoded test pattern payloads and an overhead portion containing associated FEC-encoded content.

In some aspects, the techniques described herein relate to a method, wherein deriving includes dividing the physical layer test pattern into the plurality of test pattern payloads that include test pattern codewords.

In some aspects, the techniques described herein relate to a method, wherein translating includes applying baseband modulation encoding to the plurality of test pattern payloads to produce a plurality of modulated inverse encoded test pattern payloads such that when the plurality of modulated inverse encoded test pattern payloads are baseband modulated and FEC encoded, the plurality of test pattern payloads are produced.

In some aspects, the techniques described herein relate to a method, wherein the physical layer test pattern is any ordering and/or arrangement of two or more logical levels determined or known to stress operation of a physical layer hardware component of the device.

In some aspects, the techniques described herein relate to a method, wherein the physical layer test pattern is an SSPRQ test pattern.

In some aspects, the techniques described herein relate to a method, further including: obtaining, as a result of applying the FEC framed test pattern to the device, FEC error statistics and information indicating operational performance of the device as a result of stress caused by the physical layer test pattern.

In some aspects, the techniques described herein relate to a method, wherein the device is an opto-electronic device or any device has a serializer-deserializer component or function.

In some aspects, the techniques described herein relate to an apparatus including: a memory; an input/output interface configured to enable connectivity with a device to be tested; and at least one processor coupled to the memory and the input/output interface, wherein the at least one processor is configured to perform operations including: generating a forward error correction (FEC) framed test pattern that embeds a physical layer test pattern into an FEC-encoded stream; and applying the FEC framed test pattern to the device to test physical layer operation of the device and to generate FEC error statistics.

In some aspects, the techniques described herein relate to an apparatus, wherein the at least one processor is configured to perform generating the FEC framed test pattern by: deriving from the physical layer test pattern a plurality of test pattern payloads; translating the plurality of test pattern payloads to a plurality of inverse encoded test pattern payloads such that when the plurality of inverse encoded test pattern payloads are FEC encoded, the plurality of test pattern payloads are produced; and forming the FEC framed test pattern including a sequence of codewords each of which includes a respective one of the plurality of inverse encoded test pattern payloads and an overhead portion containing associated FEC-encoded stream content.

In some aspects, the techniques described herein relate to an apparatus, wherein the at least one processor is configured to perform the deriving by dividing the physical layer test pattern into the plurality of test pattern payloads that include test pattern codewords.

In some aspects, the techniques described herein relate to an apparatus, wherein the at least one processor is further configured to perform: generating as a result of applying the FEC framed test pattern to the device, FEC error statistics and information indicating operational performance of the device as a result of stress caused by the physical layer test pattern.

In some aspects, the techniques described herein relate to a system including: a device having one or more physical layer functions; and a testing equipment configured to connect to the device, wherein the testing equipment is configured to generate a forward error correction (FEC) framed test pattern that embeds a physical layer test pattern into an FEC-encoded stream; and apply the FEC framed test pattern to the device to test physical layer operation of the device and to generate FEC error statistics.

In some aspects, the techniques described herein relate to a system, wherein the testing equipment is configured to generate as a result of applying the FEC framed test pattern to the device, FEC error statistics and information indicating operational performance of the device as a result of stress caused by the physical layer test pattern.

In some aspects, the techniques described herein relate to a system, wherein the testing equipment is configured to generate the FEC framed test pattern by: deriving from the physical layer test pattern a plurality of test pattern payloads; translating the plurality of test pattern payloads to a plurality of inverse encoded test pattern payloads such that when the plurality of inverse encoded test pattern payloads are FEC encoded, the plurality of test pattern payloads are produced; and forming the FEC framed test pattern including a sequence of codewords each of which includes a respective one of the plurality of inverse encoded test pattern payloads and an overhead portion containing associated FEC-encoded content.

In some aspects, the techniques described herein relate to a system, wherein the testing equipment derives the physical layer test pattern by dividing the physical layer test pattern into the plurality of test pattern payloads that include test pattern codewords.

In some aspects, the techniques described herein relate to a system, wherein the testing equipment performs the translating by applying baseband modulation encoding to the plurality of test pattern payloads to produce a plurality of modulated inverse encoded test pattern payloads such that when the plurality of modulated inverse encoded test pattern payloads are baseband modulated and FEC encoded, the plurality of test pattern payloads are produced.

In some aspects, the techniques described herein relate to a system, wherein the physical layer test pattern is any ordering and/or arrangement of two or more logical levels determined or known to stress operation of a physical layer hardware component of the device.

In some aspects, the techniques described herein relate to a system, wherein the physical layer test pattern is an SSPRQ test pattern.

In some aspects, the techniques described herein relate to a system, wherein the device is an opto-electronic device or any device has a serializer-deserializer component or function.

In some aspects, the techniques described herein relate to one or more non-transitory computer readable media encoded with instructions that, when executed by one or more processor devices, cause the one or more processor devices to perform operations including: obtaining a physical layer test pattern for testing operation of a device; generating a forward error correction (FEC) framed test pattern that embeds the physical layer test pattern into an FEC-encoded stream; and applying the FEC framed test pattern to the device to test physical layer operation of the device and to obtain FEC error statistics.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure are described with more particular reference to the accompanying figures above.

Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method comprising:
   obtaining a physical layer test pattern for testing operation of a device;
   generating a forward error correction (FEC) framed test pattern by deriving from the physical layer test pattern a plurality of test pattern payloads, translating the plurality of test pattern payloads to a plurality of inverse encoded test pattern payloads that, when FEC encoded, produce the plurality of test pattern payloads, and forming the FEC framed test pattern with a sequence of codewords each of which includes a respective one of the plurality of inverse encoded test pattern payloads; and
   applying the FEC framed test pattern to the device to test physical layer operation of the device and to obtain FEC error statistics and information indicating operational performance of the device as a result of stress caused by the physical layer test pattern.

2. The method of claim 1, wherein the FEC framed test pattern includes a respective one of the plurality of inverse encoded test pattern payloads and an overhead portion containing associated FEC-encoded content.

3. The method of claim 1, wherein deriving comprises dividing the physical layer test pattern into the plurality of test pattern payloads that comprise test pattern codewords.

4. The method of claim 1, wherein translating comprises applying baseband modulation encoding to the plurality of test pattern payloads to produce a plurality of modulated inverse encoded test pattern payloads such that when the plurality of modulated inverse encoded test pattern payloads are baseband modulated and FEC encoded, the plurality of test pattern payloads are produced.

5. The method of claim 1, wherein the physical layer test pattern is any ordering and/or arrangement of two or more logical levels determined or known to stress operation of a physical layer hardware component of the device.

6. The method of claim 5, wherein the physical layer test pattern is a Short Stress Pseudorandom Sequence (SSPRQ) test pattern.

7. The method of claim 1, wherein the device is an opto-electronic device or any device has a serializer-deserializer component or function.

8. An apparatus comprising:
a memory;
an input/output interface configured to enable connectivity with a device to be tested; and
at least one processor coupled to the memory and the input/output interface, wherein the at least one processor is configured to perform operations including:
generating a forward error correction (FEC) framed test pattern by deriving from a physical layer test pattern a plurality of test pattern payloads, translating the plurality of test pattern payloads to a plurality of inverse encoded test pattern payloads that, when FEC encoded, produce the plurality of test pattern payloads, and forming the FEC framed test pattern with a sequence of codewords each of which includes a respective one of the plurality of inverse encoded test pattern payloads; and
applying the FEC framed test pattern to the device to test physical layer operation of the device and to generate FEC error statistics and information indicating operational performance of the device as a result of stress caused by the physical layer test pattern.

9. The apparatus of claim 8, wherein a respective one of the plurality of inverse encoded test pattern payloads and an overhead portion containing associated FEC-encoded stream content.

10. The apparatus of claim 8, wherein the at least one processor is configured to perform the deriving by dividing the physical layer test pattern into the plurality of test pattern payloads that comprise test pattern codewords.

11. The apparatus of claim 8, wherein translating comprises applying baseband modulation encoding to the plurality of test pattern payloads to produce a plurality of modulated inverse encoded test pattern payloads such that when the plurality of modulated inverse encoded test pattern payloads are baseband modulated and FEC encoded, the plurality of test pattern payloads are produced.

12. The apparatus of claim 8, wherein the physical layer test pattern is any ordering and/or arrangement of two or more logical levels determined or known to stress operation of a physical layer hardware component of the device.

13. The apparatus of claim 12, wherein the physical layer test pattern is a Short Stress Pseudorandom Sequence (SSPRQ) test pattern.

14. A system comprising:
a device having one or more physical layer functions; and
a testing equipment configured to connect to the device, wherein the testing equipment is configured to:
generate a forward error correction (FEC) framed test pattern by deriving from a physical layer test pattern a plurality of test pattern payloads, translating the plurality of test pattern payloads to a plurality of inverse encoded test pattern payloads that, when FEC encoded, produce the plurality of test pattern payloads, and forming the FEC framed test pattern with a sequence of codewords each of which includes a respective one of the plurality of inverse encoded test pattern payloads; and
apply the FEC framed test pattern to the device to test physical layer operation of the device and to generate FEC error statistics and information indicating operational performance of the device as a result of stress caused by the physical layer test pattern.

15. The system of claim 14, wherein a respective one of the plurality of inverse encoded test pattern payloads and an overhead portion containing associated FEC-encoded content.

16. The system of claim 14, wherein the testing equipment derives the physical layer test pattern by dividing the physical layer test pattern into the plurality of test pattern payloads that comprise test pattern codewords.

17. The system of claim 14, wherein the testing equipment performs the translating by applying baseband modulation encoding to the plurality of test pattern payloads to produce a plurality of modulated inverse encoded test pattern payloads such that when the plurality of modulated inverse encoded test pattern payloads are baseband modulated and FEC encoded, the plurality of test pattern payloads are produced.

18. The system of claim 14, wherein the physical layer test pattern is any ordering and/or arrangement of two or more logical levels determined or known to stress operation of a physical layer hardware component of the device.

19. The system of claim 18, wherein the physical layer test pattern is a Short Stress Pseudorandom Sequence (SSPRQ) test pattern.

20. The system of claim 14, wherein the device is an opto-electronic device or any device has a serializer-deserializer component or function.

* * * * *